(12) United States Patent
Hamilton et al.

(10) Patent No.: US 7,656,705 B2
(45) Date of Patent: Feb. 2, 2010

(54) FAST SINGLE PHASE PROGRAM ALGORITHM FOR QUADBIT

(75) Inventors: Darlene Hamilton, White Salmon, WA (US); Fatima Bathul, Santa Clara, CA (US); Kulachet Tanpairoj, Stanford, CA (US); Ou Li, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 15 days.

(21) Appl. No.: 11/874,076

(22) Filed: Oct. 17, 2007

(65) Prior Publication Data

US 2009/0103357 A1    Apr. 23, 2009

(51) Int. Cl.
G11C 11/34 (2006.01)

(52) U.S. Cl. .............................. 365/185.03; 365/185.18; 365/185.19; 365/185.22; 365/185.24; 365/185.33

(58) Field of Classification Search ............ 365/185.03, 365/185.18, 185.19, 185.22, 185.24, 185.26, 365/185.28, 185.29, 185.33
See application file for complete search history.

(56) References Cited

U.S. PATENT DOCUMENTS

| | | | | |
|---|---|---|---|---|
| 6,538,923 B1 * | 3/2003 | Parker | .................. | 365/185.03 |
| 6,834,012 B1 * | 12/2004 | He et al. | ................ | 365/185.22 |
| 7,038,948 B2 * | 5/2006 | Hamilton et al. | ....... | 365/185.24 |
| 7,038,950 B1 * | 5/2006 | Hamilton et al. | ....... | 365/185.22 |
| 7,042,766 B1 * | 5/2006 | Wang et al. | ............ | 365/185.22 |
| 7,113,431 B1 * | 9/2006 | Hamilton et al. | ....... | 365/185.03 |
| 7,130,210 B2 * | 10/2006 | Bathul et al. | ........... | 365/185.03 |
| 7,149,126 B2 * | 12/2006 | Ogura et al. | ........... | 365/185.26 |
| 7,342,830 B1 * | 3/2008 | Chen et al. | ............. | 365/185.22 |
| 7,447,077 B2 * | 11/2008 | Ogura et al. | ........... | 365/185.28 |

* cited by examiner

*Primary Examiner*—Trong Phan
(74) *Attorney, Agent, or Firm*—Eschweiler & Associates, LLC

(57) ABSTRACT

Methods of rapidly programming a wordline of multi-level flash memory cells comprising memory cell element-pairs having three or more data levels per bit or element corresponding to three or more threshold voltages are provided. An interactive program algorithm rapidly programs the elements of the wordline of memory cells in a learn phase and a single core programming phase. In one embodiment, each wordline comprises learn element-pairs first programmed to provide learn drain voltages for programming core element-pairs along the wordline having the same program pattern of data levels. A set comprising one or more program patterns is chosen to correspond with each program level used on the wordline. The learn element-pairs are programmed to determine a learned program drain voltage for each program level. This learned program drain voltage essentially provides a wordline and program level specific program characterization of the Vd required for the remaining elements of that wordline.

25 Claims, 10 Drawing Sheets

Fig. 2B 220

| Left element Status | Left element | Right element | Right element Status | | Read left element | Read right element |
|---|---|---|---|---|---|---|
| | | | | | Case | Case |
| Blank | 1 | 1 | Blank | | 11 | 11 |
| Level 2 program | 2 | 1 | Blank | | 21 | 12 |
| Level 2 program | 2 | 2 | Level 2 program | | 22 | 22 |
| Level 2 program | 2 | 3 | Level 3 program | | 23 | 32 |
| Level 2 program | 2 | 4 | Level 4 program | | 24 | 42 |
| Level 3 program | 3 | 1 | Blank | | 31 | 13 |
| Level 3 program | 3 | 2 | Level 2 program | | 32 | 23 |
| Level 3 program | 3 | 3 | Level 3 program | | 33 | 33 |
| Level 3 program | 3 | 4 | Level 4 program | | 34 | 43 |
| Level 4 program | 4 | 1 | Blank | | 41 | 14 |
| Level 4 program | 4 | 2 | Level 2 program | | 42 | 24 |
| Level 4 program | 4 | 3 | Level 3 program | | 43 | 34 |
| Level 4 program | 4 | 4 | Level 4 program | | 44 | 44 |

222 — 224 — 226 — 228 — 230 — 232

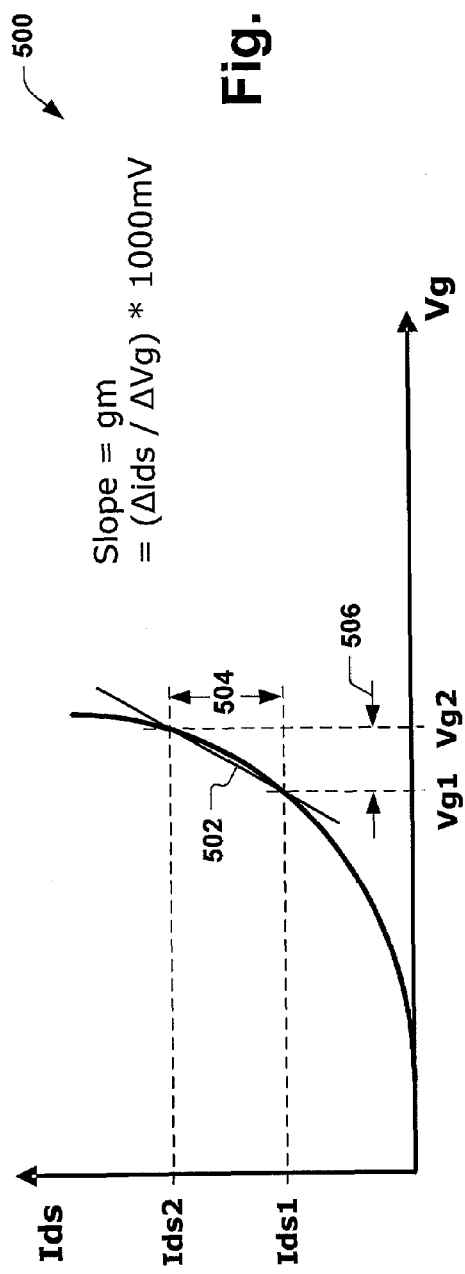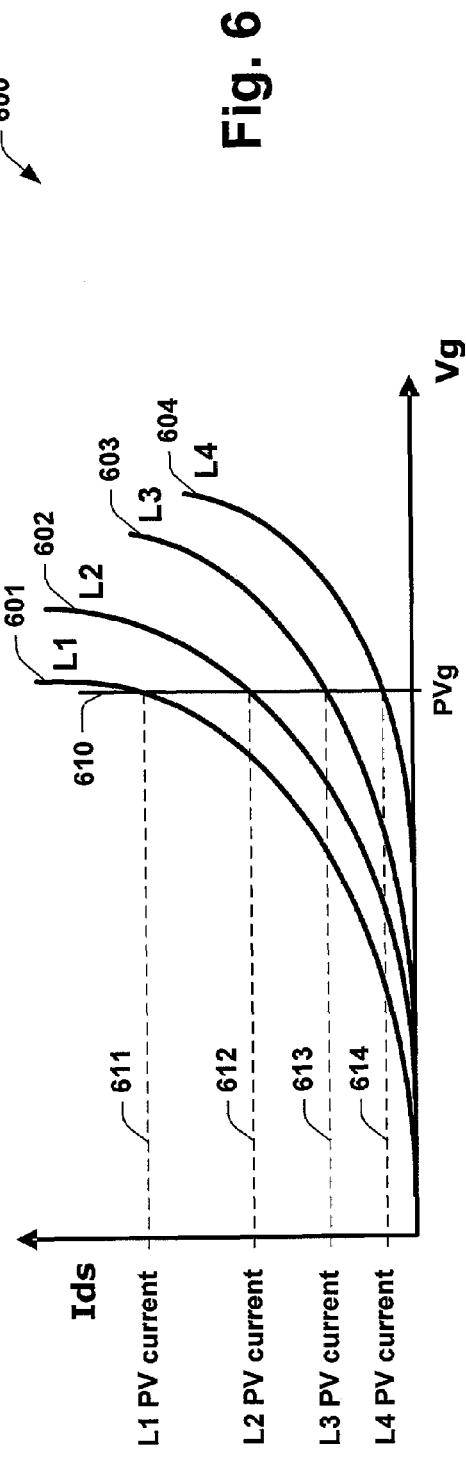

Learn programming Vd (learn phase): — 801

| Variable name | min | max | Value start value | step | Remark |
|---|---|---|---|---|---|
| Vdinit | 3000 | 6500 | 3000 mV | 100 mV | fix for all program pulses or can be stepped per pulse by a step value. |
| Vginit | | | 9500 mV | 0 | EV Vt measured at 7uA current+2.25V (from Fig. 4). |
| Vg during pgmverify | | | PV gate voltage | | |
| Vd during pgmverify | | | 1600 mV | | |
| Isense during pgmv level 2 | | | recalculate | | 300 mV worth of current higher than the target L2 PV current (from Fig. 6). |
| pulse width | | | 250 nsec | | |

Main array core programming: — 802

| Variable name | min | max | Value start/value | step | Remark |
|---|---|---|---|---|---|
| Vd level for pat 21 | | 6500 | Vd learn - x1 mV | 100mV | |
| Vd level for pat 22, 23, 24 | | 6500 | Vd learn - y1 mV | 100mV | Can be different value for each pattern. |
| Vg level for all L2 patterns | | | 9250mV | 0 | fix for all program pulses or can be stepped per pulse by a step value. |
| Vd level for pat 31 | | 6500 | Vd learn +/- x2 mV | 100mV | |
| Vd level for pat 32, 33, 34 | | 6500 | Vd learn +/- y2 mV | 100mV | Can be different value for each pattern. |
| Vg level for all L3 patterns | | | 9250mV | 0 | fix for all program pulses or can be stepped per pulse by a step value. |
| Vd level for 41 | | 6500 | Vd learn +/- x3 mV | 100mV | |
| Vd level for pat 42, 43, 44 | | 6500 | Vd learn +/- y3 mV | 100mV | Can be different value for each pattern. |
| Vg level for all L4 patterns | | | 9250mV | 0 | fix for all program pulses or can be stepped per pulse by a step value. |
| Vg during pgmverify | | | PV gate voltage | | EV Vt measured at 7uA current+2.25V (from Fig. 6). |
| Vd during pgmverify | | | 1600 mV | | |
| Isense during pgmv level 2 | | | | | target L2 PV current (from Fig. 6). |
| Isense during pgmv level 3 | | | | | target L3 PV current (from Fig. 6). |
| Isense during pgmv level 4 | | | | | target L4 PV current (from Fig. 6). |
| pulse width | | | 250 nsec | | |

Fig. 8

FAST SINGLE PHASE PROGRAM ALGORITHM FOR QUADBIT

FIELD OF INVENTION

The present invention relates generally to memory devices and the like and in particular to a method of programming a wordline or array of memory cells of flash memory devices comprising multi-level data states.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual-bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability) of EEPROM. Flash memory can be rewritten and can hold its contents without power, and thus is nonvolatile. It is used in many portable electronic products, Such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling or other mechanisms. As with many aspects of the semiconductor industry, there is a continuing desire and effort to achieve higher device packing densities and increase the number of memory cells on a semiconductor wafer. Similarly, increased device speed and performance are also desired to allow more data to be stored on smaller memory devices.

Individual flash memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the charge stored in the cell. The memory device includes appropriate circuitry to sense the resulting cell current in order to determine the charge stored therein, which is then provided to data bus terminals of the device for access by other devices in a system in which the memory device is employed.

Programming circuitry controls a bit of a cell by applying a signal to a wordline, which acts as a control gate, and changing bitline connections such that the bit is stored by the source and drain connections. Programming a cell using a suitable mechanism such as hot electron injection, generally increases the threshold voltage of a cell. In operation, individual flash cells are addressed via the respective bitline and wordline using a peripheral decoder and control circuitry for programming (writing), reading or erasing functions. Erasing is performed as a blanket operation wherein an array or sector of cells can be simultaneously erased and typically produces a lower threshold voltage in the cell.

By way of further detail, a single bit of a flash memory cell may be programmed by a suitable mechanism, such as hot electron injection. Programming with hot-electron injection involves applying a relatively high voltage to the control gate and connecting the source to ground and the drain to a predetermined potential above the source. When a resulting electric field is high enough, electrons collect enough energy to be injected from the source onto die nitride layer of the ONO flash. As a result of the trapped electrons, the threshold voltage of the cell increases. This change in the threshold voltage (and thereby the channel conductance) of the cell created by the trapped elections is what causes the cell to be programmed.

As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer (or die).

For example, another type of flash memory is dual element nitride storage flash memory, which allows multiple bits to be stored in a single cell. In this technology, a memory cell is essentially split into two identical (mirrored) or complementary regions, each of which is formulated for storing one of two independent bits or elements. Each dual element nitride storage flash memory cell, like a traditional cell, has a gate, a source, and a drain. However, unlike a traditional stacked gate cell in which the source is always connected to an electrical source and the drain is always connected to an electrical drain, respective dual element nitride storage flash memory cells can have the connections of the source and drain reversed during operation to permit the storing Of two bits or elements.

In virtual ground type architectures, dual element nitride storage flash memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits or elements per cell by applying a signal to the wordline, which acts as a control gate, and changing bitline connections such that one element is stored by the source and drain being connected in one arrangement and a complementary element is stored by the source and drain being connected in another arrangement.

The closeness of such dual element nitride storage flash architectures, however, also causes certain undesirable phenomena to become prevalent. For example, isolating two elements or charges stored within a charge trapping layer becomes increasingly difficult as the channel length is decreased and the bits or elements are brought closer together. In this manner, the charge on the elements can contaminate or disturb one another, causing operations performed on the elements to be more challenging and introducing a greater opportunity for error. This interdependency or the affect that bits or elements can have on one another is sometimes referred to as complementary bit disturb or CBD.

Regardless of the flash architecture employed, reliably and accurately programming dual element nitride storage flash and multi-level flash cells can be particularly sensitive with the attendant complications of maintaining narrow Vt distributions in order to accurately read and determine a data state from a corresponding Vt level. In addition, even if such narrow distributions are attained for the various multiple levels, unless sectors of memory cells can be programmed to within the acceptable limits quickly, efficiently, and reliably, little competitive advantage may be gained.

In view of the foregoing, a continued need exists for an improved method of quickly and efficiently programming multi-level flash memory cells of a wordline, sector or array while maintaining CBD control that achieves narrow Vt distributions of the programmed element states.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention quickly programs a wordline of multi-level flash memory bits (MLB) or elements having three or more data levels or data states corresponding to three or more threshold voltages by applying an interactive program algorithm that programs the wordline of memory cells in a learn phase and a single programming phase to achieve rapid programming and highly compact Vt distributions. The three or more data levels or data states include a blank level (e.g., L1) or erased state and two or more program levels (e.g., L2, L3, L4). In addition, the method of the present invention is particularly applicable to cells having one or more physical elements per cell, for example, two elements per memory cell or one element-pair per memory cell. The possible (e.g., three or more) data levels of the two elements of each element-pair, for example, provide a number of unique bit pattern combinations which are termed "program patterns" herein. Of these program patterns, another program pattern subset may represent those patterns which are associated with programming the elements of the element-pairs to a program level which is above the blank level or erased state.

In one embodiment, each wordline of a memory array comprises two or more memory cell element-pairs (e.g., dual element nitride storage flash cells having two physical bits or complementary bits per cell), the memory cell element-pairs of the wordline comprising learn element-pairs and core element-pairs. In one embodiment, cell element-pairs that are to be programmed to the same program pattern or multiple patterns are selected along a wordline. A program verify gate voltage (PVg) and a program verify current (PV current) for each of the program levels (e.g., L2, L3, L4) on the wordline of the memory array are provided or determined. A set of program patterns (e.g., 21, 31, 41, 22, 23, 32, 24, 42, 33, 34, 43 and 44, such as the four data levels of a QuadBit memory cell) is chosen for the wordline, for example, which represents each unique program and data level combination. Then, the learn element-pairs are first programmed to provide a learned program drain voltage at each program level. Thereafter, the learned program drain voltages are used to program the core element-pairs along the wordline having the same corresponding program level or program pattern.

The learned program drain voltages essentially provide a wordline and program level specific program characterization of the Vt required for the remaining bits or elements of the core memory elements of that wordline.

In one embodiment of the learn programming operation or phase, the program drain voltage required to program a selected number of elements to a predetermined one of three or more data levels is determined or learned, comprising a learned program drain voltage. A program pattern from the set or unique combinations of program patterns is selected. The learn element-pairs along the wordline are program verified using the program verify gate voltage and the program verify current, to identify unprogrammed and programmed element-pairs which may have been already programmed to the selected program pattern. An initial gate voltage (Vg) for programming the learn element-pairs according to the program pattern is selected. An initial drain voltage for programming the learn element-pairs is also selected starting from, for example, the lowest allowable drain voltage for the program level used in the program pattern. Program pulses are then applied to the unprogrammed learn element or elements on the wordline using the initial gate and drain voltages. The elements are then reprogram verified to identify the remaining unprogrammed elements. If unprogrammed elements are still identified, the drain voltage is increased according to a predetermined voltage step increase, for example, or another type or manner of voltage increase. The program pulsing, drain voltage increasing, and program verification continues in this manner until all elements of the element-pairs associated with the selected program pattern have been programmed (program verified). The final drain voltage that results from these step increases is then saved as the learned program drain voltage for the corresponding program level of the program pattern.

In another aspect, the predetermined Vd or Vg step increases comprise a profile of successive programming pulses (e.g., about 50-200 mV step per program pulse of about 150 ns-2 µs pulse width) applied to the memory cells. The bits of the complementary element-pairs may be alternately programmed until the Vt of the individual bits achieve a final target threshold voltage Vt.

In another embodiment, in the core element-pair programming operation or phase, the MLB cells of the wordline are programmed with the learned program drain voltages learned in the learn program phase, for example, by applying pulses initially having the corresponding learned program drain voltage. As in the learn phase, the core element-pair program pulsing, drain voltage increasing, and program verification continues in a similar manner until all elements of the memory core element-pairs associated with the selected program pattern have been programmed (program verified), wherein a final target threshold voltage of the core element-pairs is achieved.

In another aspect of the present invention, one or both of the programming gate and drain voltages may both be varied and may be determined by a look-up table corresponding to the program levels and determined as a function of the respective learned program drain voltages. In yet another aspect of the invention, either the drain voltage or the gate voltage is held constant while the other of the voltages follows values in the look-up table or according to a programming profile.

In another aspect of the invention, the Vd and/or Vg of the programming pulses may be represented as programming profiles which may further be tailored to accommodate the various combinations of program patterns possible within the element-pair. For example, in a dual element nitride storage flash four level cell, there are 16 possible states or combinations of element-pair patterns (e.g., 11, 12, 21, 13, 31, 14, 41, 22, 23, 32, 24, 42, 33, 34, 43, 44), and 12 possible program patterns (e.g., 21, 31, 41, 22, 23, 32, 24, 42, 33, 34, 43, 44). In this way, the memory cells of each wordline are characterized by obtaining the learned program drain voltages from the learn element-pairs, then the core element-pairs are programmed to a corresponding data level to achieve a more precise Vt distribution and compensate for or mitigate the effects of complementary bit disturb.

The multi-level bit MLB flash memory cell of the present invention may comprise a single physical element of the cell that can be programmed to three or more levels corresponding to three or more data states. Alternately, the MLB cell may comprise a dual element nitride storage flash or mirror-bit cell having two physically distinct elements that may each be programmed to multiple levels such as four, wherein 16 possible states are then available. The method may be suitably implemented in a variety of flash memory architectures including single and dual element nitride storage flash EEPROM, and other such single or multi-bit memory architectures that may be electrically programmed, and any such cell or variant is contemplated as falling within the scope of the present invention.

The present invention provides a method of programming a wordline of an array of MLB memory cells that yields a well controlled narrow Vt distribution using minimal programming time, while maintaining CBD control.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 2B is a chart of possible program pattern combinations for a dual element nitride storage flash memory cell such as a QuadBit flash memory cell, wherein each of the elements can be stored at four (4) different data levels and wherein a program element is programmed to a non-blank level (program level) in the method of the present invention.

FIGS. 4, 5, and 6 are data plots illustrating several schemes for determining a program verify gate voltage (PVg), determining the transconductance (gm) of a cell, and for determining a program verify currents (L1, L2, L3, L4 PV current) for all the program levels, respectively, for the exemplary MLB memory cells in accordance with the programming method of FIG. 3.

FIG. 8 is a chart of an exemplary look-up table of Vd and Vg values for the learn programming phase and the core memory cell programming phase, wherein the core memory cell programming phase determines the program drain voltage as a function of the learned program drain voltages determined in the learn programming phase in accordance the method of FIG. 3 of the present invention.

DETAILED DESCRIPTION OF THE INVENTION

Figure 1A:
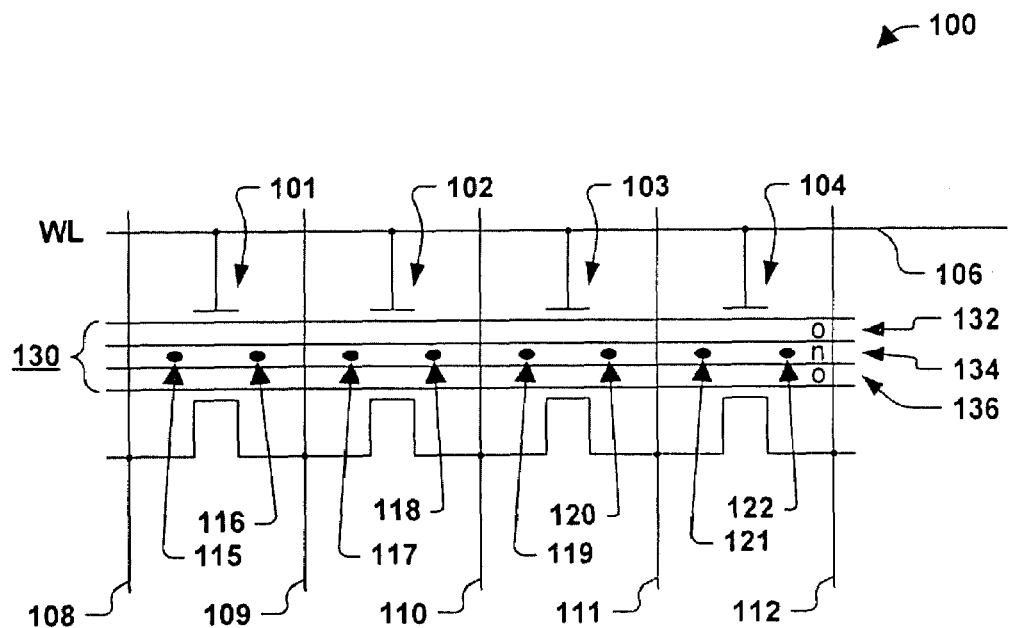
FIG. 1A is a schematic illustration of a portion of a wordline of dual element nitride storage flash memory cells.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Improvements in the density of memory devices translate to increased memory capacity. Density and thus capacity is a major consideration in the cost of fabrication and the marketability of memory devices, and is directly related to the amount of real estate used to store a bit of information on a semiconductor chip. Density may be increased, for example, by scaling down feature size to accommodate more memory cell transistors on a given size chip thereby achieving higher density. Another technique to increase density and reduce manufacturing costs is thru the use of multi-level cell technology, Multi-level cells increase cell density by increasing the number of possible logical states or data states associated with a cell, thereby allowing a single memoirs cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in one example, a single dual element nitride storage flash cell may have two physical bits or elements of data each at four or more Vt levels corresponding to four or more logical states. Cells, having multiple levels, however, present many new problems attempting to maintain well controlled or tight distributions of the Vt levels, particularly as larger data bit quantities are considered.

As a result of these trends, accurate programming, erasure, and the determination of the levels of such multi-level cells becomes increasingly demanding, particularly as higher bit capacities are expected of a single cell. Accordingly, multi-level memory cells need to be programmed quickly and efficiently to save program operations time and power consumption. In addition, the cells need to be programmed to a well controlled narrow program Vt distribution (tight bit compacting). Such device requirements and issues are likely to increase as device features continue to shrink and the density of memory cells increases.

As indicated previously, however, due to such high density architectures that include dual element nitride storage flash type cell structures, the charge on the bits or elements can contaminate or disturb one another referred to as complementary bit disturb or CBD. This interdependency or the affect that elements can have on one another causes operations performed on the elements to become more challenging and introducing greater opportunity for error. As a result, effectively programming such dual element nitride storage flash and multi-level cells in this environment must also consider minimizing such CBD effects.

Accordingly, it is a goal of the present invention to provide a method of programming a wordline of an array of suitable MLB flash memory cells, which achieves the aforementioned requirements while also providing improved Vt program distributions, levels of speed, endurance, reliability, as well as minimal CBD effects.

A multi-level program algorithm may be used in accordance with the present invention to program words having, for example, 8, 16, or 32 bits per word of an array of multi-level flash memory cells MLB to a desired element-pair pattern. The program algorithm of the present invention may be applied in two or more program phases, for example. In a first or learn phase, the programming algorithm learns the program drain voltage Vd required to program each of the program patterns required for the learn bits or elements on a wordline using a predetermined Vg. All the learn elements of the wordline receive program pulses at the predetermined gate voltage Vg, applied successively. As the learn elements of the wordline become programmed to this learn program Vd, the programmed elements are read verified to one of a predetermined PV current (e.g., L1 PV current, L2 PV current, L3 PV current, L4 PV current), until each pattern is programmed and the corresponding Vd voltage is stored as the learned Vd for each respective level. As the learn elements of the wordline become programmed, they are deselected from the wordline to prevent over-programming, while programming continues for the other elements yet to be programmed according to the respective PV current.

Then, in the second or core programming phase, the core cells along the wordline are programmed using the learned Vd voltages at the program levels of the respective program patterns using successive program pulses, having predetermined gate and drain core programming voltages incrementally stepped to higher voltages based on the learned Vd voltages.

As the core cell elements now become programmed to the program levels of the respective program patterns, the programmed elements are once again deselected from the wordline to prevent over-programming. The algorithm achieves well controlled compact Vt distributions compared to those of some conventional single phase methods. The method may be suitably implemented in a variety of flash memory architectures including single and dual element nitride storage flash EEPROM, and other such single and multi-bit memory architectures that may be electrically programmed, and any such cell or variant is contemplated as falling within the scope of the present invention.

Referring initially to FIG. 1A, a schematic illustration is presented of a portion of a wordline of dual element nitride storage flash core memory cells 100 such as may be included in at least part of an array of multi-level flash memory cells. The circuit schematic shows a group of memory cells 101 through 104 in a virtual ground type implementation, for example. The respective memory cells 101 through 104 are connected to a wordline 106, which serves as a control gate, and pairs of the memory cells share a common bitline. For instance, in the example shown, the memory cell 101 has associated bitlines 108 and 109; the memory cell 102 has associated bitlines 109 and 110; the memory cell 103 has associated bitlines 110 and 111; and the memory cell 104 has associated bitlines 111 and 112. As such, cells 101 and 102 share bitline 109, cells 102 and 103 share bitline 110 and cells 103 and 104 share bitline 111, respectively.

Depending upon wordline voltages and bitline connections, the memory cells 101 through 104 are capable of writing, reading, and erasing elements at locations 115 through 122. In addition to voltages applied to the wordline 106, reading the element (e.g., "A" bit of cell 101) at location 115, for example, is achieved through connection of the drain to the bitline 109 and the source to the bitline 108. Similarly, reading the element (e.g., "B" bit of cell 101) at location 116 is achieved through connection of the drain to the bitline 108 and the source to the bitline 109. Storage of multiple elements is made possible, at least in part, by a charge trapping dielectric layer 130 interposed between the bitlines and the wordline. The charge trapping dielectric layer 130 includes multiple insulating layers 132, 136 (e.g., of oxide based material) that sandwich a charge trapping layer 134 (e.g., of nitride based material). Given its layer to layer composition, the charge trapping dielectric layer 130 is often referred to as an ONO layer (for the oxide, nitride, oxide layers).

The ONO layer 130 allows the different elements to be stored at multiple states or levels as well. For example, depending upon the voltage applied to the memory cells 101 through 104 by the control gate or wordline 106 during programming, varying amounts of charge can be stored at locations 115 through 122. The different amounts of charge may correspond to different bit or element states or levels, for example. If four different charge levels or data levels (e.g., 1, 2, 3 and 4) can be stored at each of the element locations 115 through 122, for example, then each two-element cell 101 through 104 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4) which may also be represented as (e.g., 11, 12, 13, 14, 21, 22, 23, 24, 31, 32, 33, 34, 41, 42, 43 and 44), respectively.

Figure 1B:
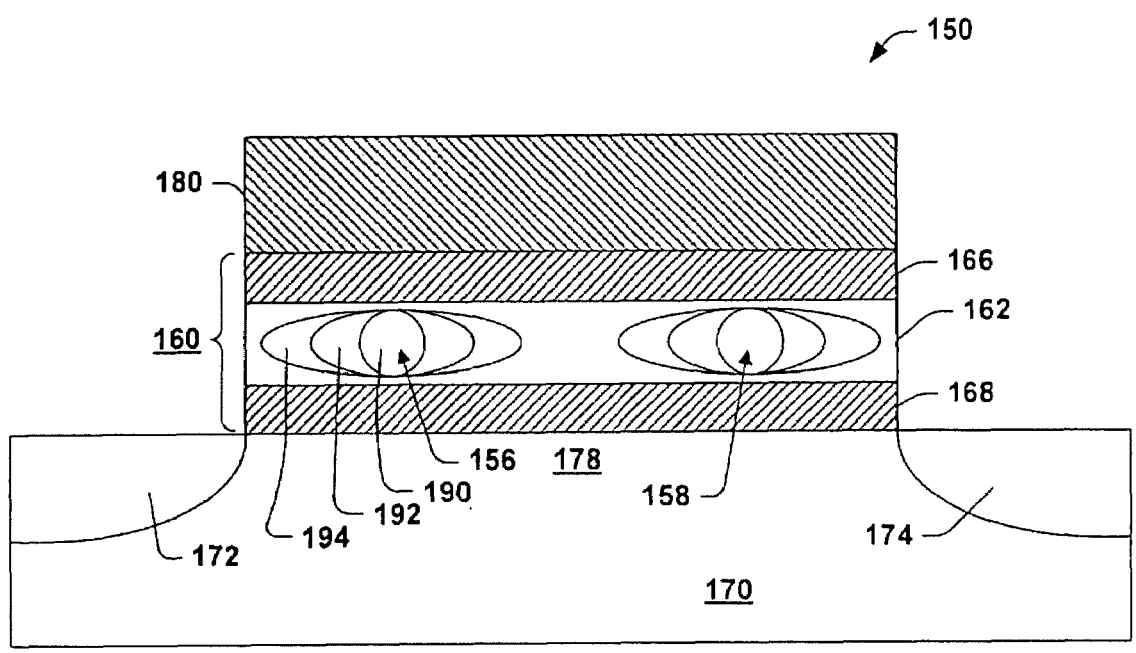
FIG. 1B is a cross-sectional view of a dual element nitride storage flash memory cell wherein each of the elements can be stored at multiple levels.

FIG. 1B is a cross sectional view of a dual element nitride storage flash memory cell 150 illustrating the capability of the cell to store varying degrees of charge at element locations 156 and 158. It will be appreciated that the memory cell 150 may, for example, correspond to the memory cells 101 through 104 depicted in FIG. 1A. The cell 150 includes a charge trapping dielectric layer (ONO layer) 160 that comprises a charge trapping layer 162 sandwiched between two dielectric layers 166, 168. The charge trapping layer 162 is formed from one or more substantially non-conductive substances, such as nitride based materials. The dielectric layers 166, 168 are similarly formed from one or more electrically insulating substances, such as oxide based materials.

The charge trapping ONO layer 160 is formed over a substrate 170 that may be formed from silicon or some other semiconductor material, for example. The substrate 170 may be selectively doped with a p-type dopant, such as boron, for example, to alter its electrical properties. In the example illustrated, the substrate 170 has buried bitlines or bitline diffusions including a first bitline diffusion 172 and a second bitline diffusion 174. The bitline diffusions 172 and 174 may, for example, be formed by an implanted n-type dopant, and may correspond to bitlines 108 through 112 in FIG. 1A. A channel 178 is defined within the substrate between the first 172 and second 174 bitline diffusions (e.g., S/D extensions, deep S/D regions).

Overlying the upper dielectric layer 166 of the ONO layer 160 is a gate 180. This gate 180 may be formed from a polysilicon material, for example, and may be doped with an n-type impurity (e.g., phosphorus) to alter its electrical behavior. The gate 180 may, for example, correspond to the wordlines 106 in FIG. 1A. The gate 180 enables a voltage to be applied to the cell 150 such that respective charges can, among other things, be stored within the cell at locations 156, 158, depending upon the electrical connections of the bitline diffusions 172, 174.

The dual element nitride storage flash memory cell 150 is generally symmetrical, thus the bitline diffusions 172 and 174 are interchangeable as acting source and drain. Thus, the first bitline diffusion 172 may serve as the source and the second bitline diffusion 174 as the drain with respect to right element location 158 for programming. Likewise, the second bitline diffusion 174 may serve as the source and the first bitline diffusion 172 as the drain for the left element location 156 for programming. The cell 150 can be programmed by applying a voltage across the gate 180 and an acting drain region, and connecting an acting source region to ground, for example.

When programming the cell 150, the acting drain region is typically biased to a potential above the acting source. As a result of the gate bias, a high electric field is applied across the charge trapping layer 162. Due to a phenomenon known as "hot electron injection", electrons pass from the acting source region through the lower dielectric layer 168 and become trapped in the charge trapping layer 162 at locations 156 or 158, also known as left element location 156 and right element location 158. It will be appreciated that a second element can be programmed to the alternate location 158 or 156 by reversing the acting source and drain and again applying a bias to the control gate 180.

By way of example, the left element location 156 can be programmed by applying a program voltage to the gate 180 and a drain voltage to the second bitline 172, which is an acting drain for the left location 156. The first bitline 174, which is an acting source for programming the left element location 156, can be connected to ground, or biased to a different voltage level. The applied voltages generate a vertical electric field through the dielectric layers 168 and 166 and also through the charge trapping layer 162, and generate a lateral electric field across a length of the channel 178 from the first bitline diffusion 172 to the second bitline diffusion 174. At a given voltage, the channel 178 inverts such that electrons are drawn off the acting source (the first bitline diffusion 174 in this example) and begin accelerating towards the acting drain (the second bitline diffusion 172 in this example).

As the electrons move along the length of the channel 178, the electrons gain energy and, upon attaining enough energy, the electrons jump over the potential barrier of the bottom dielectric layer 168 and into the charge trapping layer 162, where the electrons become trapped. The probability of electrons jumping the potential barrier in this arrangement is a maximum in the area of the left element location 156, adjacent the first bitline diffusion 172, where the electrons have gained the most energy. These accelerated electrons are termed hot electrons and, once injected into the charge trapping layer 162, stay in about the general area indicated for the left element. The trapped electrons tend to remain generally localized due to the low conductivity of the charge trapping layer 162 and the low lateral electric field therein. Programming the right element location 158 is similar, but the first bitline 174 operates as an acting drain and the second 172 operates as an acting source.

For a read operation, a certain voltage bias is applied across an acting drain to an acting source of the cell 150. The acting drain of the cell is a bitline, which may be connected to the drains of other cells in a byte or word group. A voltage is then applied to the gate 180 (e.g., the wordline) of the memory cell 150 in order to cause a current to flow from the acting drain to the acting source. The resulting current is measured, by which a determination is made as to the value of the data stored in the cell. For example, if the current is above a certain threshold, the element is deemed unprogrammed or a logical one, whereas if the current is below a certain threshold, the element is deemed to be programmed or a logical zero. A second element can be read by reversing operations of the first and second bitline diffusions 172 and 174 for the acting drain and the acting source.

It can be appreciated that if the voltages utilized to program the left 156 and right 158 element locations of the cell 150 are increased or sustained for longer periods of time, the number of electrons or amount of charge stored at these locations can be increased or otherwise varied. This allows the cell 150 to be utilized for additional data storage. For example, different amounts of charge can correspond to different programmed states. In the example illustrated, for instance, both the left 156 and right 158 element locations can be said to have four different states or levels, namely 1, 2, 3 and 4, where level 1 (L1) corresponds to a situation where the locations are blank or un-programmed, and levels 2, 3 and 4 (L2, L3, and L4, respectively) correspond to programmed levels or increased amounts of stored charge, respectively. With regard to the left element location 156, for example, a level 2 may correspond to a relatively small amount of stored charge 190, while levels 3 and 4 may correspond to increasingly larger amounts of stored charge 192 and 194, respectively. As indicated previously, this technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit or element. One way this has been done is by using multiple (three or more, in the context of cell levels and states) threshold voltage (Vt) levels, which correspond to multiple data states per cell. This contrasts to the two states or levels used in conventional flash memory cells. Thus, in the example above, a single dual element nitride storage flash cell may store in each of its two physical bits or elements, four Vt levels corresponding to four logical states.

Figure 2A:
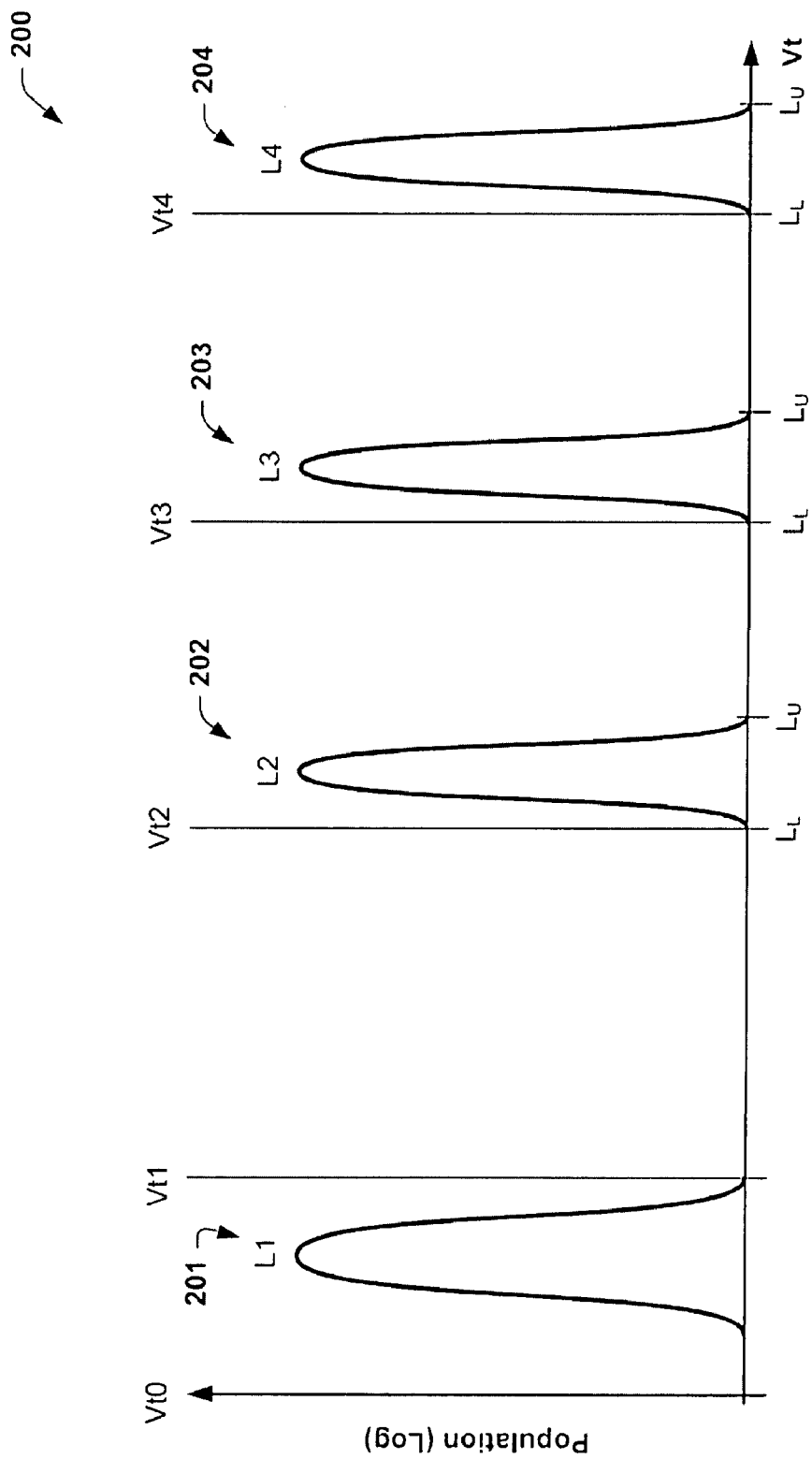
FIG. 2A is a Vt distribution of a four level multi-level cell in accordance with an aspect of the present invention and such as may apply to the dual element nitride storage flash cell of FIG. 1B.

For example, FIG. 2A illustrates an unsigned Vt distribution 200 of a four level MLB cell in accordance with an aspect of the present invention is illustrated. Vt distribution 200 represents four discrete populations of memory bit threshold voltages. Each threshold voltage population occupies a range of Vt values separated into four discrete designated levels L1 201, L2 202, L3 203, and L4 204. Each level (e.g., L1, L2, L3, and L4) of the respective Vt population further has a corresponding target threshold voltage, for example, Vt1, Vt2, Vt3, and Vt4, respectively. For purposes of simpler program and read verification, the target threshold voltage for the corresponding level may be located at one of the upper Vt limits (LU) or lower Vt limits (LL) of the respective level as shown. For example, if L1 is chosen as the erased state of a four-level device, a voltage read detected below Vt1 indicates an erased or unprogrammed state, while a Vt voltage detected greater than Vt2 but less than Vt3 indicates an L2 level, a Vt voltage detected greater than Vt3 but less than Vt4 indicates an L3 level, and a Vt voltage detected greater than Vt4 indicates an L4 level.

The various levels of FIG. 2A, however, may be arbitrarily assigned corresponding binary states (e.g., L1=11, L2=10, L3=01, and L4=00, or L1=00, L2=01, L3=10, and L4=11) as desired by the user. The four-level MLB cell associated with the distribution 200 may comprise a single physical bit or element that can be programmed to two levels or more (plus a blank level), or alternatively, may comprise a dual element nitride storage flash cell having two physically distinct elements that may each have multiple levels such as four, wherein 16 or more possible combinations of states between two elements.

The method of the present invention is suitably implemented in MLB memory devices having any number of levels and combination of both positive mad negative Vt distributions. In FIG. 2A, for example, the method of the present invention is equally applicable whether Vt0 or Vt1, Vt4, or another such Vt limit is used as a zero voltage potential or another reference potential of the memory cells. Although the example would seem to imply that the L1 level corresponds to the erased condition, the L1, L4, or any other level may represent the erased state. Further, target threshold voltages Vt2, Vt3, and Vt4 may, for example, have values such as Vt2=1.5V, Vt3=2.1V, and Vt4=2.7V from Vt1.

Considering the four levels of FIG. 2A as applied to the dual element nitride storage flash memory elements examples of FIGS. 1A and 1B, the method of the present invention may be used to program learn memory element-pairs (learn element-pairs, learn cells) initially erased to L1 data states to a target threshold voltage of Vt2, Vt3, or Vt4, as desired, corresponding to the L2, L3, and L4 data states in a learn programming phase operation or learn phase. As shown in FIG. 2A, of this first learn programming phase, pulses are applied to the learn element-pairs chosen along a wordline to be programmed to a selected word, bit pattern or "program pattern", such as 21 (L2 for the left element, and L1 for the right element) or any other combination of words or program patterns. Pulses are applied according to a predetermined Vd profile of successive programming pulses (e.g., about 50-200 mV step per program pulse of about 50 ns-2 μs pulse width) applied to the memory cells, while the gate voltage (Vg) is either held constant or also applied according to a predetermined pulsing profile (e.g., stepped pattern, ramp pattern). The elements of the complementary element-pairs are alternately programmed in this way, until the Vt of each element of the element-pair achieves the respective final target threshold voltage corresponding to the respective program level.

A learned program drain voltage (learned Vd) required to achieve the target threshold voltage (e.g., Vt2, Vt3, and Vt4) for the respective program levels (e.g., L2, L3, and L4) is determined according to a corresponding predetermined program verify current (PV current) and program verify gate voltage (PVg).

Then in a second or core programming phase, the method programs the core element-pairs (core memory cells) along the wordline with another Vd profile of successive programming pulses computed as a function of the learned Vd, to a final target threshold voltage corresponding to the selected word (bit pattern or program pattern desired), as will be discussed in greater detail infra. As in the learn phase, the gate voltage Vg of the core programming phase is again held constant at an appropriate voltage, but alternately, may be applied according to a predetermined pulsing profile based upon information learned during the learn phase.

Thus, an objective of the method of the present invention is to program the core memory cells of the array in a fast and efficient manner based upon the learned Vd voltages for the program levels.

Another objective of the method of the present invention is to narrow, or "compact" the population boundary levels $L_U$ and $L_L$ closer to one another, as is also illustrated in FIG. 2A. Sigma is often used to symbolize the standard deviation of such a population, which is a measure of the variability of the population. Accordingly, a smaller sigma indicates a narrower Gaussian distribution of the population, indicating that more bit threshold voltages are populated closer to the target Vt(target).

The contributors of the present invention have realized that to get a predictable and well-controlled programmed Vt distribution from MLB core cells, one solution is to first learn what Vd (and alternately the Vg) is required to program a select group of learn element-pairs along the same wordline to a select programmed state having a well controlled Vt distribution. The contributors of the present invention have further observed and appreciated that each time a programming operation is performed on a particular group of memory bits or elements that the group progressively tends to compact themselves closer to the same Vt potential. Accordingly, the inventors have devised an interactive method of iteratively programming the core elements in single programming phase to final target Vt values. These iterative operations tend to progressively cause the program Vt distributions to narrow and compact toward the target Vt level. Further, an initial erase operation to a controlled target threshold voltage may be utilized to enhance the effectiveness of the method of the present invention. As a result, this method may be faster and more energy efficient than some other conventional single phase methods.

FIG. 2B illustrates a chart 220 of possible program pattern combinations for a duel element nitride storage flash memory cell such as a QuadBit flash memory cell 150 of FIG. 1B in accordance the method of the present invention. For example, each of the elements of the element-pair can be stored at four (4) different data levels L1, L2, L3, and L4, and wherein a program element is programmed to a non-blank level (program level L2, L3, and L4).

Chart 220 further illustrates a left element (e.g., element 156 of cell 150 of FIG. 1B) in column 224, and a right element (e.g., element 158 of cell 150 of FIG. 1B) in column 226 of FIG. 2B. Column 222 indicates the left element status (e.g., a blank or program level), while column 228 indicates the right element status (e.g., a blank or program level). Column 230 illustrates the bit pattern represented by the respective element-pair when the left element is read from the cell, while column 232 illustrates the bit pattern represented by the respective element-pair when the right element is read from the cell.

Figure 2C:
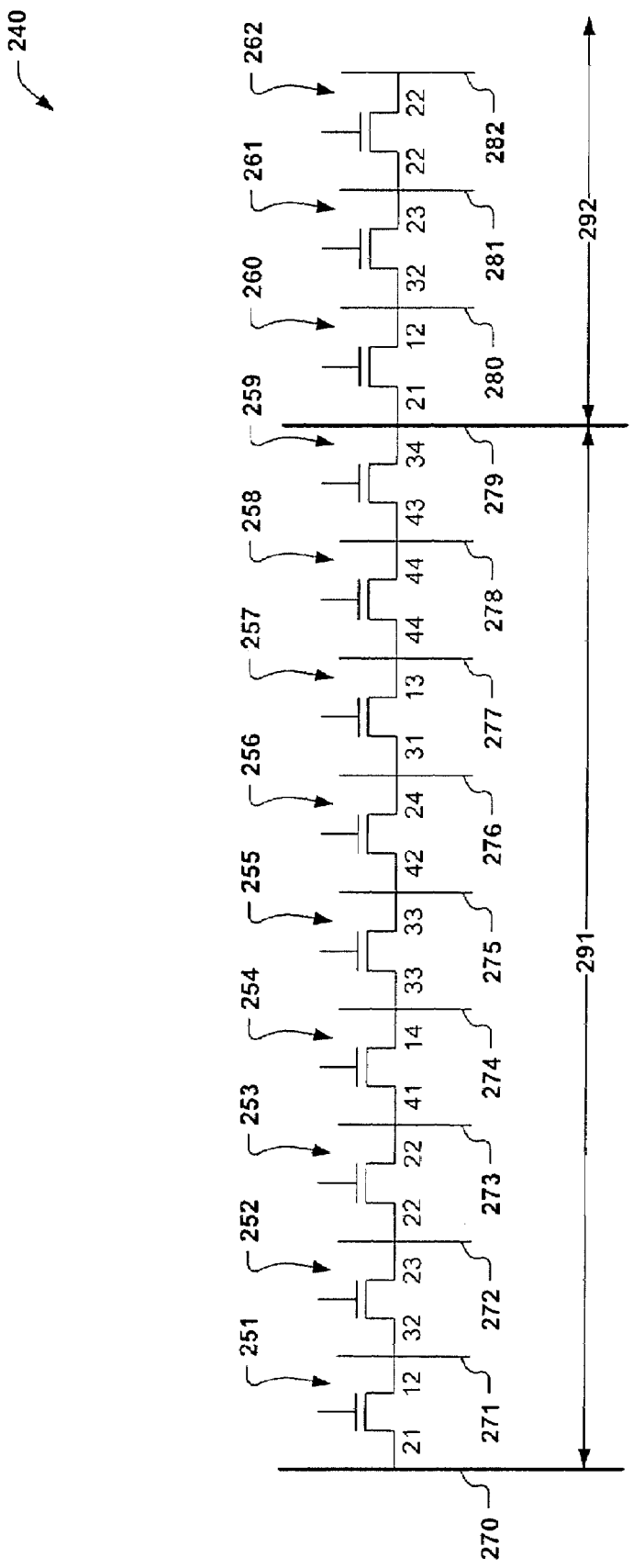
FIG. 2C is a schematic illustration of a portion of a wordline of QuadBit flash memory cell element-pairs and further illustrates a set of program patterns such as may be used to program the memory cell element-pairs.

FIG. 2C illustrates a portion of a wordline 240 of QuadBit flash memory core cell element-pairs (e.g., 251, 252, ... 262) arranged between respective bitlines (e.g.,270, 271, ... 282), and further illustrates a set of program patterns (e.g., 21, 32, 23, 22, 41, 33, 42, 24, 31, 44, 43, 34) comprising a sample set of adjacent memory cells 291. Wordline 240 further illustrates a partial next set of program patterns, comprising a next set of memory cells 292, which generally repeats the first set of program patterns 291 along the length of the entire wordline. The program pattern sets 291 or 292, for example, comprise all the unique program patterns such as 21, 32, 23, 22, 41, 33, 42, 24, 31, 44, 43, 34 that are utilized along a wordline. During the learn programming phase or operation to identify the Vd voltages required to program the various program levels (e.g., L2, L3, and L4) in core element-pairs, a select number of memory cells other than the core cells above are used to program select programming patterns like 21, 31, 41 used as learn element-pairs.

By programming the learn element-pairs of a wordline according to the selected program pattern or patterns during the learn phase, it is intended to achieve a representative sampling of the programming Vd and Vg voltages required to subsequently program the core element-pairs during the core programming phase or operation.

Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

Figure 3:
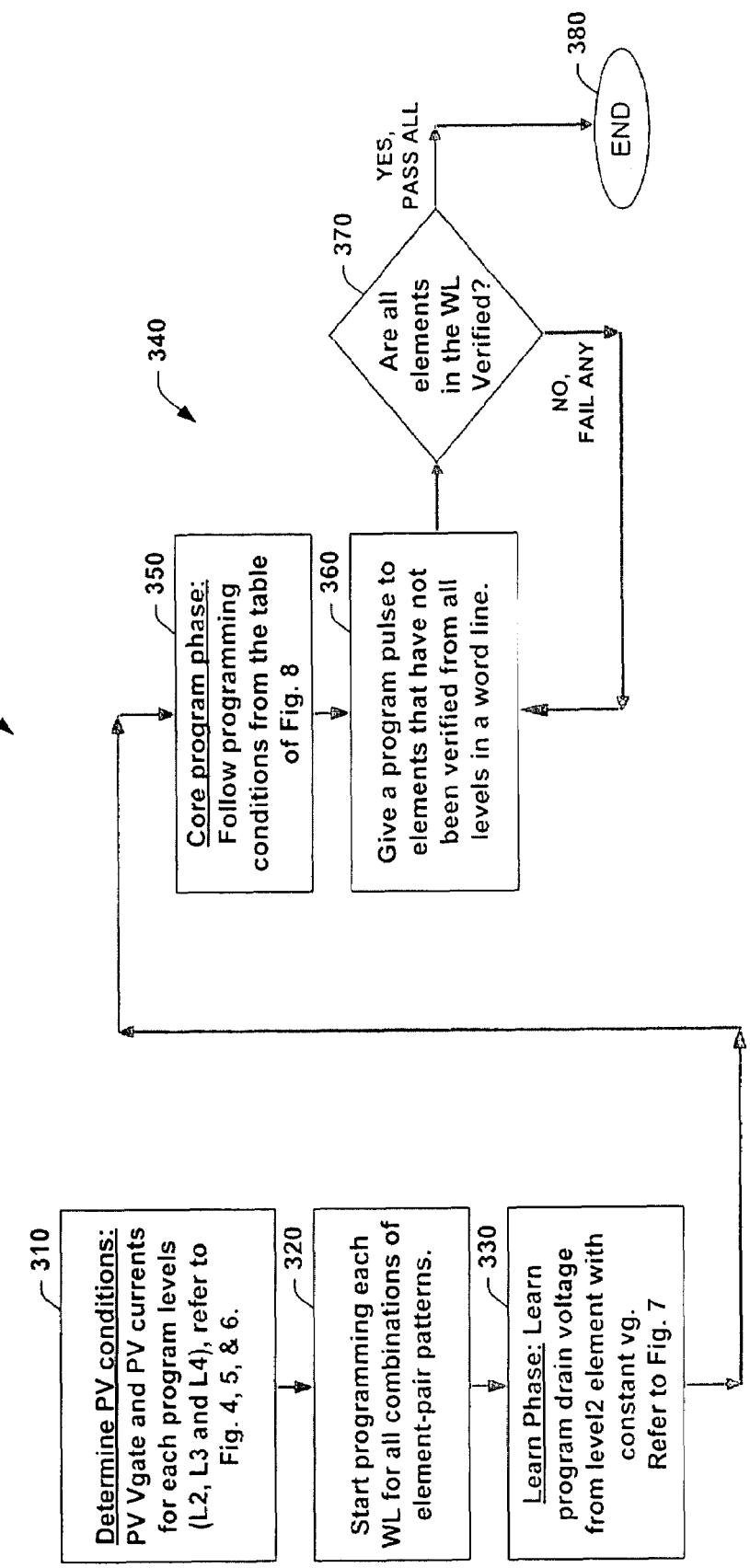
FIG. 3 is flow diagram illustrating an exemplary method of programming a wordline of MLB memory cells that includes a learn phase Vd characterization of one or more learn element-pairs at each of the program levels, and a core programming phase of one or more core element-pairs at the respective program levels based on the learned program drain voltage level for the respective program levels, wherein the algorithm interactively programs memory cells in accordance with an aspect of the present invention.

FIG. 3 illustrates a flow diagram of an exemplary method 300 of interactively programming a wordline of multi-level flash memory bits or elements (MLB memory cells) in a single programming phase in accordance with an aspect of the present invention. The memory cells comprise cell element-pairs individually having two or more program levels and a blank level, the levels comprising three or more data levels corresponding to three or more threshold voltages. The method 300 includes a learn phase Vd characterization of one or more learn element-pairs at each of the program levels, and a core programming phase for programming one or more core element-pairs at the respective program levels based on the learned program drain voltage level for the respective program levels.

While the term "wordline" or "array" is used throughout, it should be understood that such terms are not to be construed as limiting to one specified grouping of cells or bits, but rather may apply to any grouping of MLB cells including single or multi-bit cells.

FIGS. 4-8 further illustrate charts, tables and flow diagrams of details of the various computations and operations of the MLB programming method 300 of FIG. 3. Assume for the sake of the following method discussion and the examples of FIGS. 4-8, a dual element nitride storage flash (complementary element-pair) four-level per bit or element flash memory cell similar to that of FIGS. 1A and 1B and the wordline of FIG. 2C with L1 representing a blank or erased state, and L4 representing the highest level similar to the levels of FIGS. 2A and 2B. Although L1 will represent the erased state in this example, it should be appreciated that method 300 will work for any erase and program level assignments and Vt distribution polarities of MLB memory cells or bits, and such variations are contemplated as falling with the scope of the present invention.

Figure 9:
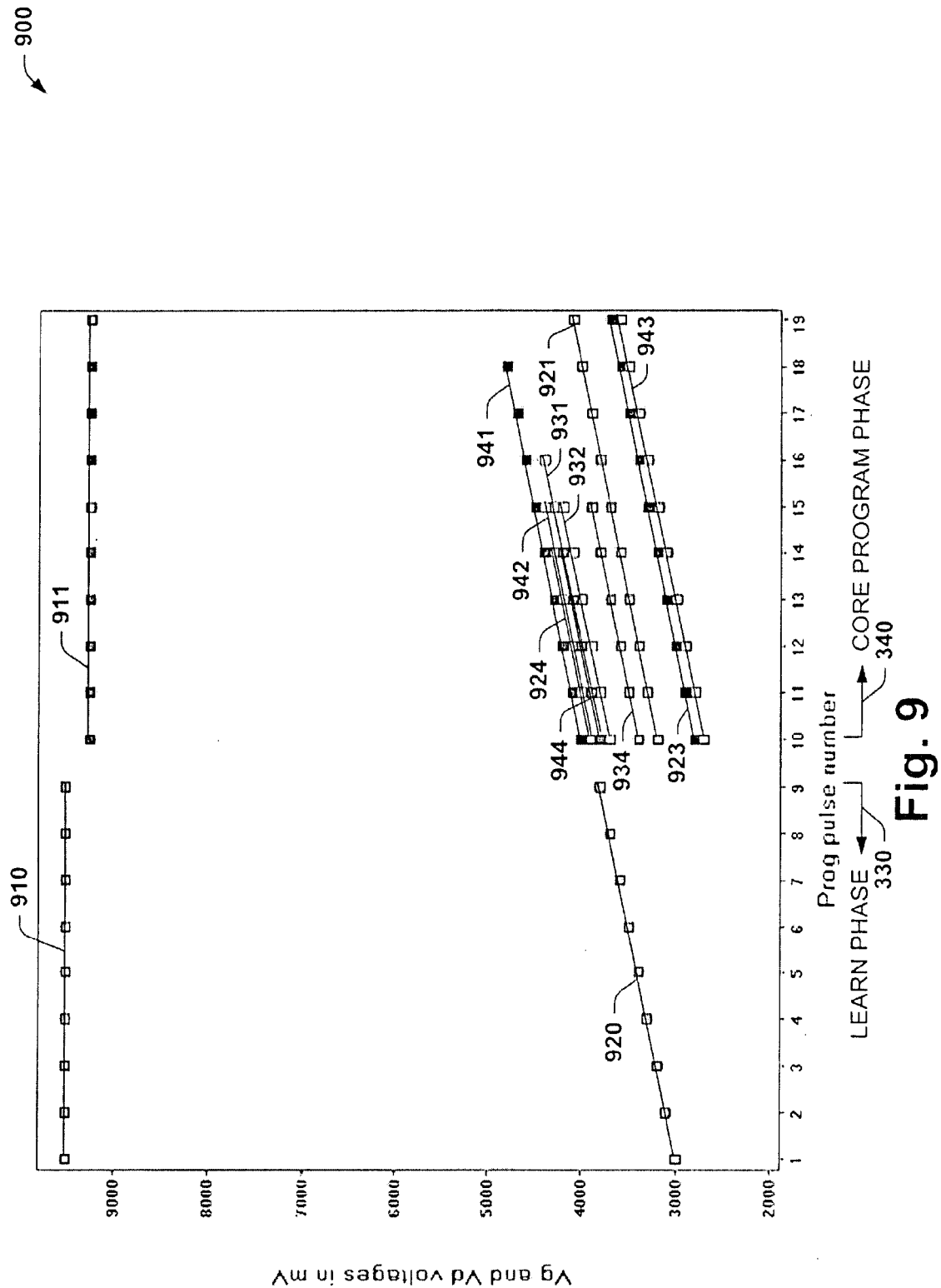
FIG. 9 is a plot of exemplary drain and gate voltages (profiles) such as may be applied as pulses to the memory cell element-pairs of FIG. 2C during programming in the learn phase and the core program phase of the exemplary programming algorithm of FIG. 3.

For example, method 300 of FIG. 3 includes a two-phase algorithm for interactively programming memory bits or elements of a wordline in accordance with the present invention. In addition, the exemplary method includes an optional initial sample program verify characterization in FIGS. 4-6 for the purpose of generating a program verify gate voltage PVg and PV currents for the program levels of the wordline. In the learn program phase 330 of method 300, learn element-pairs of the cells are programmed to learn the drain voltages Vd which are required to program the cells to the respective program levels (e.g., L2, L3, and L4 of FIGS. 2A and 2B) utilized by the corresponding program patterns of the learn element-pairs. In the second phase or core programming phase, the elements of the core memory, cells or core element-pairs are programmed during the core programming phase using these learned drain voltages for the respective program levels (e.g., L2, L3, and L4 of FIGS. 2A and 2B). FIG. 9 will further illustrate a pulse-by-pulse plot 900 of an exemplary learn phase 330 and core program phase 340 for programming of a wordline of MLB memory cells using the exemplary method 300.

For example, initially in the multi-level program algorithm 300, one or more elements of unprogrammed or blank (L1) multi-level flash memory cells (e.g., cells 101-104 of FIG. 1A) on a specific wordline (e.g., WL 106 of FIG. 1A, or 240 of FIG. 2C) may be provided by selecting learn and core cells that are to be programmed to the same element-pair program pattern. For example, a group of 8, 16, 32, or higher bits per word multi-level cells that are to be programmed to a "21" programming pattern (e.g., L2 on the left element, and L1 on the right element) of the element-pair are selected along a specific wordline. In another example suitable for the method, a similar word grouping of single (physical) bit cells that are to be programmed to a (e.g., L2, L3, L4) level may also be selected along the wordline. Thus, in one example, a word (e.g., of 8, 16, 32, or higher bits per word) of cell element-pairs (e.g., dual element nitride storage flash cells having two physical bits or complementary bits per cell) that are to be programmed to the same program pattern are selected along a common wordline.

At 310 of the multi-level program algorithm 300, the program verify (PV) conditions are determined based one or more sample cells of the array. A program verify gate voltage PVg is determined according to FIGS. 4 and 5, and a PV current for each of the program levels (e.g., L2, L3, L4) is determined according to FIG. 6.

Figure 4:
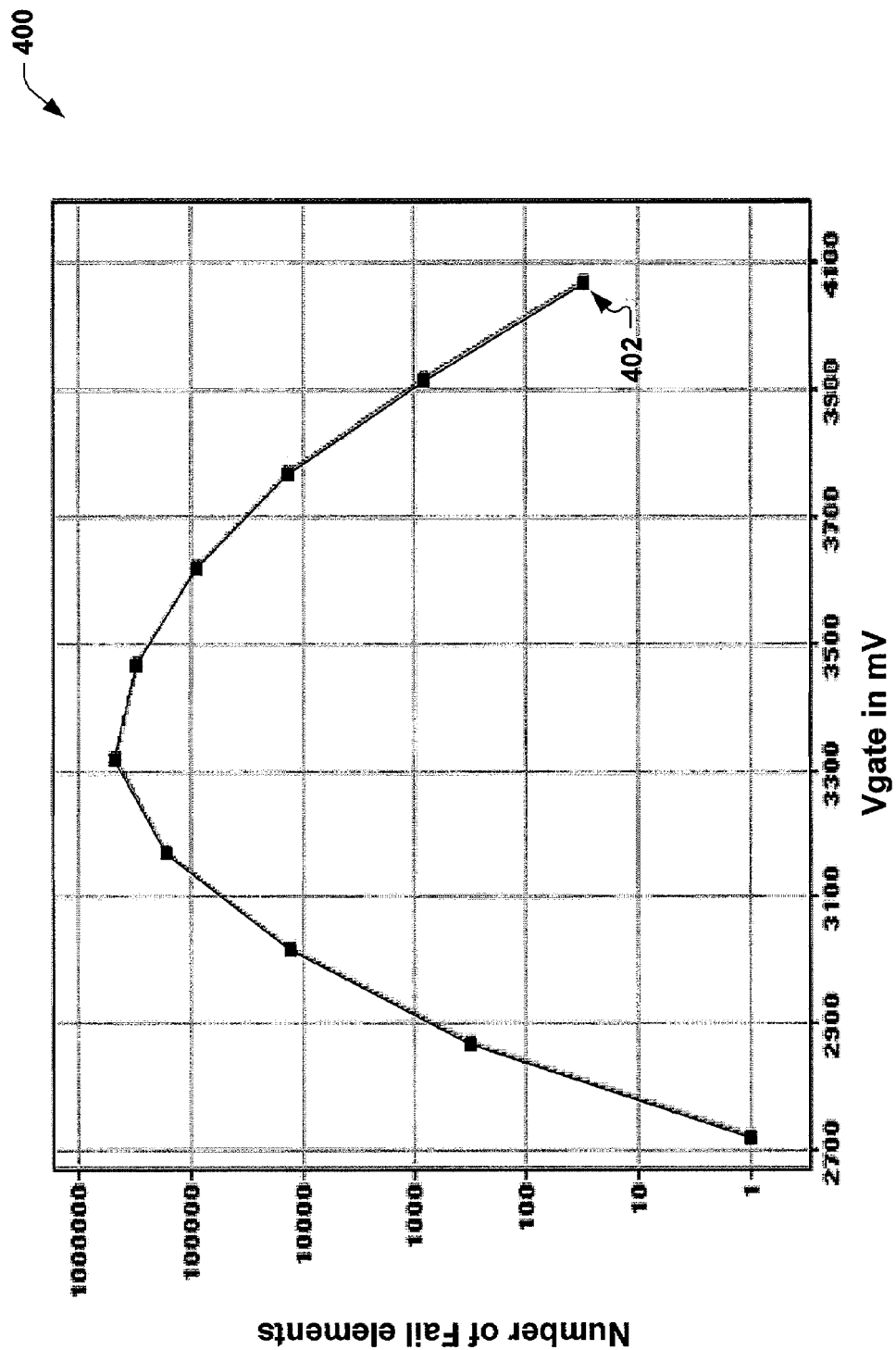

For example, FIGS. 4, 5, and 6 illustrate several schemes for determining a program verify gate voltage (PVg), determining the transconductance (gm) of a cell, and for determining a program verify currents (L2, L3, L4 PV current) for all the program levels, respectively, for the exemplary MLB memory cells in accordance with the programming method 300 of FIG. 3.

At 310, and in reference to the exemplary Vt distribution plot 400 of FIG. 4, the program verify gate voltage PVg is determined, for example, by reading a blank (erased—11 state) of a sector or a wordline (WL) at a sample current level (e.g., 7 μA). The "Y" axis of FIG. 4 illustrates an exemplary (log) relationship of the number of bits or elements of the sector or wordline that fail to pass or achieve the program verify (PV) voltage and current conditions, while the "X" axis illustrates exemplary gate voltages Vgate (e.g., from 2700 to 4100 millivolts) applied to the elements of the sector or wordline during the program verify. Then, the erase verify (EV) Vt level 402 is determined from the upper end of the 11 bit pattern distribution as shown at the extreme right side of the Vt distribution plot 400 of FIG. 4, for example, according to:

$PV$ gate voltage $(PVg)=EV\ Vt+\Delta Vt$ from $EV\ Vt$ $\Delta Vt=2.25$ V, (from the plot 400)

therefore:

$PVg=4\ V+2.25\ V$ $PVg=6.25\ V.$

Also at 310, and in reference to the exemplary Vg vs. Ids plot 500 of FIG. 5, the transconductance (gm) 502 of a cell is determined, for example, by measuring two Ids current values (e.g., Ids1, and lds2) at two Vgate values (e.g., Vg1, and Vg2). From these two values, the transconductance gm 502 may be computed as the slope 502 of the difference between the two current values $\Delta$Ids 504 and the difference between the two gate voltage values $\Delta$Vg 506 as shown in FIG. 5, for example, according to:

Slope=$gm=\Delta Ids/\Delta Vg*1000$ mV

Finally at 310, and in reference to the exemplary Vg vs. Ids plot 600 of FIG. 6, the program verify currents L1 PV current 611, L2 PV current 612, L3 PV current 613, and L4 PV current 614 for all the levels L1 601, L2 602, L3 603, and L4 604 of a cell is determined, for example, at the intersection of the program verify gate voltage PVg 610 (e.g., 6.25 V) determined above from FIG. 4, for example, and according to:

L2 PVcurrent=7 $\mu$A$\div$(($Vt\ L4-Vt\ L2$)*$gm$/1000 mV)

L3 PVcurrent=7 $\mu$A$\div$(($Vt\ L4-Vt\ L3$)*$gm$/1000 mV)

L4 PV current=7 $\mu$A. (7 $\mu$A is an example value)

Returning to FIG. 3, at 320, each wordline (WL) is interactively programmed with the selected programming pattern (e.g., 21) of a programming word or set of program patterns (e.g., word 291 of FIG. 2C) corresponding to each program level. In particular, the selected element-pairs are interactively programmed for all combinations of the quad-bit patterns (e.g., element pairs, word 291/292) utilized on each respective wordline (e.g., 240).

Figure 7:
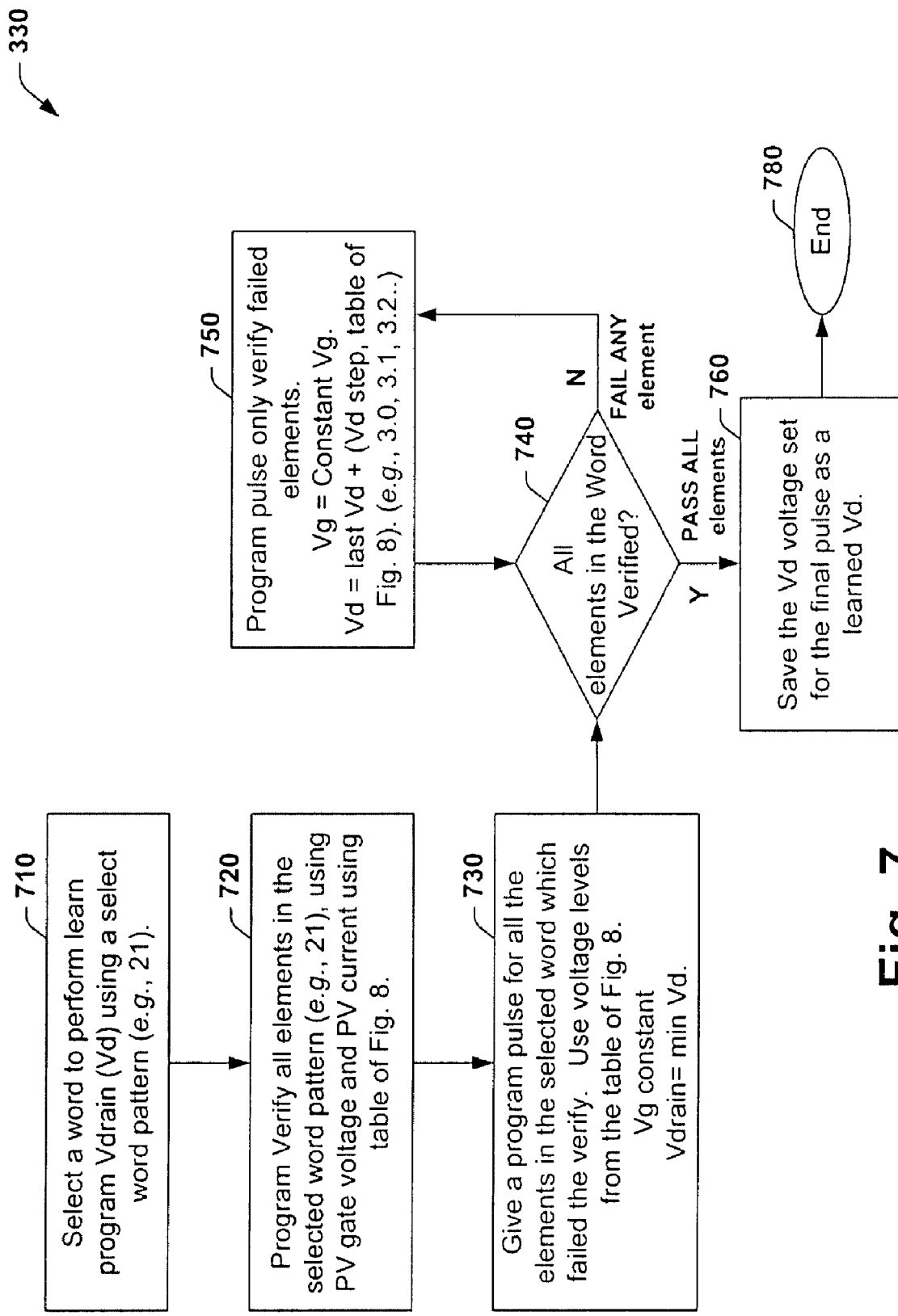
FIG. 7 is flow diagram illustrating an exemplary method of the learn phase utilized to learn the program drain voltage required to program the learn element-pairs at each of the program levels or a single program level of a wordline of. MLB memory cells in accordance with an aspect of the present invention.

At 330 of FIG. 3 and also FIG. 7, the learn phase programming begins, wherein at 710 a word or element-pair pattern (e.g., 21) is selected to perform the learn programming on the wordlines of the selected element-pairs utilizing a series or Vd pulses with a constant Vg level, however, the Vg level may also be stepped per pulse as indicated at "learn phase" or "learn programming" table 801 of FIG. 8. (e.g., see "pulse width" in an exemplary "variable name" listing in column 810, having a starting value of 250 nsec as in "starting value" column 816 of FIG. 8).

It will be appreciated that the selection of the element-pair pattern of the learn phase can be any pattern, not limited to the 21 pattern, and can be multiple patterns for different levels. The actual number of learn element-pairs chosen within each group is arbitrary. Further, these learn element-pairs may comprise bits that are reserved for this purpose, or they may be later used for data storage. Level L1 may be excluded from this list, as L1 represents the erased, blank, or unprogrammed state in this example. The lowest allowable drain voltage (Vd) for each of the program levels may selected as an initial starting value for subsequently programming each group of learn element-pairs and incrementing drain voltage (Vd) and/or gate voltage (Vg) (e.g., in steps of 100 mV), as shown in the exemplary "step size" column 818 of FIG. 8).

Initially, however, a program verify is accomplished at 720 on all bits of the selected word using, for example, PV gate voltages and the PV currents (e.g., PVg, L2 PV current 612, L3 PV current 613, and L4 PV current 614) determined earlier at 310, and determined according to, for example, the learn phase table 801 of FIG. 8. This initial program verify operation will identify those element-pairs which require further programming, and those which do not and can therefore be deselected from further programming.

Then, at 730, program pulsing begins based on the Vd and Vg voltage levels and a stepping profile determined from the learn phase table 801 of FIG. 8. Table 801 indicates that the initial Vd voltage (e.g., Vdinit at 816) starts at, for example, 3000 mV (3.0 V), which may also be a minimum value as in "min" column 812 and may also have a maximum value as in "max" column 814, and the initial Vg voltage (e.g., Vginit at 816) starts at 9500 mV (9.5 V). Learn phase table 801 also indicates, for example, that the Vd may be stepped at about 100 mV per program pulse with a pulse width of 250 ns, as shown in the exemplary "step-size" column 818 of FIG. 8). "Remarks" column 820 of FIG. 8 also lists some example conditions which may be relevant to the respective "variables" of column 810, and/or the "starting value" formulas or values of column 816. The pulsing may be iteratively applied at 750 to the failed bits determined at 740 with these increasing program Vd (e.g., 3.0V, 3.1V, 3.2V . . . ) according to: Vd=last Vd+Vd step per table 801, up to a maximum Vd voltage of 6500 mV, or until the respective PV current (e.g., L2 PV current 612, L3 PV current 613, and L4 PV current 614) is achieved at 720 or 740, 750 and 760, utilizing a Vd voltage of about 1600 mV during program verify, for example. Other such learn phase conditions, will also be appreciated by those skilled in the art and as such are anticipated within the context of the present invention.

Also at 330 and at 740, when all the selected cells/bits have eventually become programmed as indicated by a corresponding PV current, the list Vd voltage level required to accomplish this programming is stored as the learn Vd for each of the respective program levels of the wordline at 760 and the learn phase of the programming ends at 780. Generating a dynamic drain voltage Vd in this way essentially provides a program level and wordline specific program characterization of the Vd required for the remaining bits or elements of the core on that wordline (WL).

The verify pass condition of act 740 proceeding to step 760 is the "read" of the existing data at the PVgate voltage (PVg) and sensing current (PV current). In a program verify, the bit or element passes when the current is equal to or lower than the program verify current. This state is known as a read "0" logic state.

The verify fail condition of act 740 proceeding to act 750 is the "read" of the existing data at the PV gate voltage (PVg) and sensing current (PV current). In a program verify, the bit fails when the current is higher than the program verify current. This state is known as a read "1" logic state.

The core programming phase 340 begins at 350, wherein the core element-pairs along the corresponding wordline are programmed using the respective learned drain voltages Vd and the core programming phase (main array programming) table 802 of FIG. 8. For example, the Vd levels utilized for programming each of the levels of the core element-pairs are computed as a function of the learned Vd levels derived from the learn phase programming, according to the formulas illustrated in the "starting vale" column 816 of the core programming phase table 802 of FIG. 8.

In particular, the selected element-pairs are interactively programmed to the respective program level by iteratively applying program pulses at 360 to the failed bits until the program verify is reached. Voltages Vg, Vd during program verify (e.g., 1600 mV) and respective currents (Isense=target L2, L3, or L4 PV current) indicate at 370 that the element-pairs of the respective wordline (e.g., 240 of FIG. 2C) are programmed at each respective program level according to table 802 of FIG. 8.

Thereafter, the core programming phase 340 of the selected wordline (WL) is completed at 380 and the method 300 will be repeated for each additional wordline of the associated array.

By programming in this way based upon the learned Vd levels and learn element-pairs, the bits of the core memory cells may be quickly and efficiently programmed near to the target Vt without actually becoming over programmed.

FIG. 9 illustrates a pulse-by-pulse plot 900 of the exemplary learn phase 330 and core program phase 340 for programming of a wordline (e.g., 291 of FIG. 2C) of MLB memory cells, for example, using the exemplary method 300 of FIG. 3.

For example, plot 900 of FIG. 9 further illustrates that during the learn phase 330, the gate voltage (Vg) 910 is held constant (or pulsed) at 9500 mV, while the drain voltage (Vd) pulses at 920 are step-wise pulsed starting at 3000 mV at 1, and increment or step up with each successive pulse to 3900 mV at pulse 9. The learn phase 330 programming of the learn element-pairs ends at pulse 9 when the program verify voltage and PV current conditions are met. As the learn phase ends, the learned Vd voltages for each of the respective program levels (e.g., Vd at L2, Vd at L3 and Vd at L4) are saved for the subsequent core programming phase 340.

The core programming phase 340 of plot 900 of FIG. 9 begins at pulse 10, wherein the learned voltages are computed according to the table 802 of FIG. 8, for example. At pulse 10, for example, a constant gate voltage (Vg) 911 is applied and held constant (or pulsed) at 9200 mV, while the drain voltage (Vd) pulses are applied and incremented starting at a voltage which corresponds to the respective level. For example, core programming plot 921 corresponds to the programming of a 21 element-pair pattern of core cells, which begins programming at a Vd of about 3200 mV at pulse 10 and increments by 100 mV with each successive pulse to 4100 mV at pulse 19, wherein the program verify conditions are met indicating that the bits or elements are programmed. The Vd programming level is computed from table 802 of FIG. 8 based on the learned Vd achieved during the 21 element-pair pattern programming of the learn element-pairs during the learn phase.

In another example, core programming plot 934 corresponds to the programming of a 34 element-pair pattern of core cells, which begins programming at a Vd of about 3400 mV at pulse 10 and increments by 100 mV with each successive pulse to 3900 mV at pulse 15, wherein the program verify conditions are met indicating that the bits or elements are programmed.

Similarly, core programming plot 923 corresponds to the programming of a 23 element-pair pattern of core cells, plot 924 corresponds to the programming of a 24 element-pair pattern, 931 corresponds to the programming of a 31 element-pair pattern, 932 corresponds to the programming of a 32 element-pair pattern, 941 corresponds to the programming of a 41 element-pair pattern, 942 corresponds to the programming of a 42 element-pair pattern, 943 corresponds to the programming of a 43 element-pair pattern, and 944 corresponds to the programming of a 44 element-pair pattern, which all start at pulse 10 and increment until the program verify conditions are met indicating that the elements are programmed.

It is further anticipated that any combination of Vd stepping and Vg stepping may be utilized to achieve the learn Vd during the learn phase and/or the programming of the core cells during the core programming phase in accordance with one or more aspects of the present invention.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of programming two or more memory cell element-pairs on a wordline of a multi-level flash memory array in a single programming phase, the memory cell element-pairs individually having two or more program levels and a blank level, the levels comprising three or more data levels corresponding to three or more threshold voltages, the method comprising:

providing one or more unprogrammed memory cell core element-pairs of the two or more memory cell element-pairs on the word line to be programmed;

providing one or more memory cell learn element-pairs of the two or more memory cell element-pairs on the wordline for determining a program drain voltage therefrom;

determining a program verify gate voltage and program verify current for each of the program levels on the wordline of the memory array;

performing a patterned programming operation on the memory cell learn element-pairs of the wordline of the array using one or more program patterns, the determined program verify gate voltage, and the determined program verify current, until each element of the learn element-pairs generally corresponds to the respective program pattern;

learning a program drain voltage required to program the wordline to a predetermined one of the three or more data levels; and performing a core programming operation on the core element-pairs of the array using the learned program drain voltage and the determined program verify current, until each element of the core element-pairs generally corresponds to the respective program pattern.

2. The method of claim 1, wherein the one or more program patterns individually comprise one program level followed by at least one data level, and wherein each program pattern is selected corresponding to one of the two or more program levels.

3. The method of claim 1, wherein the determined program verify gate voltage is applied to each element of the learn element-pairs and the core element-pairs during a program verify operation of the memory array following the patterned programming operation.

4. The method of claim 1, further comprising using a look-up table of at least one of a programming level, and an incremental programming level to be used in performing one or more of the patterned programming operation and the core programming operation.

5. The method of claim 1, wherein learning the program drain voltage required to program the wordline to the predetermined one of the three or more data levels, comprises:
 a) selecting a program pattern from the one or more program patterns;
 b) program verifying all the element-pairs on the wordline associated with the selected program pattern using the program verify gate voltage and program verify current, to identify unprogrammed element-pairs, and programmed element-pairs which have been programmed according to the selected program pattern;
 c) selecting an initial gate voltage for programming the learn element-pairs according to the program pattern;
 d) selecting an initial drain voltage for programming the learn element-pairs starting from the lowest allowable drain voltage for the program level used in the program pattern;
 e) applying a program pulse to the unprogrammed element-pairs on the wordline using the initial gate and drain voltages;
 f) reprogram verifying all the element-pairs associated with the selected program pattern using the program verify gate voltage and program verify current;
 g) if all the element-pairs on the wordline associated with the selected program pattern are determined to be programmed in the reprogram verify:
  saving the drain voltage as a learned program drain voltage;
 h) if any of the element-pairs associated with the selected program pattern are determined to be unprogrammed in the reprogram verify:
  increasing the drain voltage according to a predetermined voltage step increase, and
  reapplying a program pulse to the unprogrammed element-pairs on the wordline using the initial gate voltage and the increased drain voltage, and
 i) repeating steps f) thru h) until all the element-pairs associated with the selected program pattern are determined to be programmed.

6. The method of claim 5, wherein the predetermined voltage step increase is derived from a look-up table of at least one of a drain voltage value, an incremental drain voltage value, a gate voltage value, and an incremental gate voltage value.

7. The method of claim 5, wherein the selecting a program pattern from the one or more program patterns comprises initially selecting a first program pattern corresponding to a first program level and saving the resulting learned first drain voltage, then repeating the drain voltage learning for each of the other two or more program levels and respective learned program drain voltages.

8. The method of claim 5, wherein the selecting a program pattern from the one or more program patterns comprises initially selecting a first program pattern corresponding to the lowest program level and saving the resulting learned first drain voltage, then repeating the drain voltage learning for each of the other two or more program levels and respective learned program drain voltages.

9. The method of claim 5, wherein the selecting a program pattern from the one or more program patterns comprises initially selecting a first program pattern corresponding to the lowest program level and saving the resulting learned first drain voltage, then determining each of the other learned program drain voltages based on the learned first drain voltage of the first program level.

10. The method of claim 1, wherein the performing a core programming operation on the core element-pairs of the array using the learned program drain voltage and the determined program verify current, until each element of the core element-pairs generally corresponds to the respective program pattern, comprises:
 a) selecting a program pattern from the one or more program patterns;
 b) program verifying all the element-pairs on the wordline associated with the selected program pattern using the program verify gate voltage and program verify current, to identify unprogrammed element-pairs, and programmed element-pairs;
 c) selecting a core gate voltage for programming the core element-pairs according to the program pattern;
 d) utilizing the learned program drain voltage for the corresponding program level used in the selected program pattern as an initial value for programming the core element-pairs;
 e) applying a program pulse to the unprogrammed element-pairs on the wordline using the core gate voltage and the learned program drain voltage;
 f) reprogram verifying all the element-pairs associated with the selected program pattern using the program verify gate voltage and program verify current;
 g) if all the element-pairs on the wordline associated with the selected program pattern are determined to be programmed in the reprogram verify:
  repeating steps a) thru g) for each of the other one or more program patterns at each of the other two or more program levels and respective learned program drain voltages;
 h) if any of the element-pairs associated with the selected program pattern are determined to be unprogrammed in the reprogram verify:
  increasing the program drain voltage incrementally according to a predetermined voltage step increase,
  reapplying a program pulse to the unprogrammed element-pairs on the wordline using the core gate voltage and the increased program drain voltage, and
 i) repeating steps f) thru h) until all the element-pairs associated with the selected program pattern are determined to be programmed.

11. The method of claim 10, wherein the predetermined voltage step increase is derived from a look-up table of at least one of a drain voltage value, an incremental drain voltage value, a gate voltage value, and an incremental gate voltage value.

12. The method of claim 10, wherein the predetermined voltage step increases comprises a predetermined drain voltage pattern and a predetermined gate voltage pattern that are applied to the elements over successive programming pulses.

13. The method of claim 10, further comprising erasing a portion of the elements of the memory array prior to performing the patterned programming operation.

14. The method of claim 1, wherein until each element of the core element-pairs generally corresponds to the respective program pattern, comprises:

until a sense current of each element of the core element-pairs generally corresponds to the determined program verify current for the respective program pattern.

15. A method of programming two or more memory cell element-pairs on a wordline of a multi-level flash memory array in a single programming phase, the memory cell element-pairs individually having two or more program levels and a blank level, the levels comprising three or more data levels corresponding to three or more threshold voltages, the method comprising:

providing one or more unprogrammed memory cell core element-pairs of the two or more memory cell element-pairs on the word line to be programmed;

providing one or more memory cell learn element-pairs of the two or more memory cell element-pairs on the wordline for determining a program drain voltage therefrom;

determining a program verify gate voltage and program verify current for each of the program levels on the wordline of the memory array;

performing a patterned programming operation on the memory cell learn element-pairs of the wordline of the array using a one or more program patterns and the determined program verify gate voltage, until a sense current of each element of the learn element-pairs generally corresponds to the determined program verify current for the respective program pattern;

learning a program drain voltage required to program the wordline to a predetermined one of the three or more data levels; and performing a core programming operation on the core element-pairs of the array using the learned program drain voltage, until a sense current of each element of the core element-pairs generally corresponds to the determined program verify current for the respective program pattern.

16. The method of claim 15, wherein the one or more program patterns individually comprise one program level followed by at least one data level and wherein each program pattern is selected to correspond with each program level used on the wordline.

17. The method of claim 15, wherein the determined program verify gate voltage is applied to each element of the learn element-pairs and the core element-pairs during a program verify operation of the memory array following the patterned programming operation.

18. The method of claim 15, further comprising using a look-up table of at least one of a programming level, and an incremental programming level to be used in performing one or more of the patterned programming operation and the core programming operation.

19. The method of claim 15, wherein learning the program drain voltage required to program the wordline to the predetermined one of the three or more data levels, comprises:

a) selecting a program pattern from the one or more program patterns;
b) program verifying all the element-pairs on the wordline associated with the selected program pattern using the program verify gate voltage and program verify current, to identify unprogrammed element-pairs, and programmed element-pairs which have been programmed according to the selected program pattern;
c) selecting an initial gate voltage for programming the learn element-pairs according to the program pattern;
d) selecting an initial drain voltage for programming the learn element-pairs starting from the lowest allowable drain voltage for the program level used in the program pattern;
e) applying a program pulse to the unprogrammed element-pairs on the wordline using the initial gate and drain voltages;
f) reprogram verifying all the element-pairs associated with the selected program pattern using the program verify gate voltage and program verify current;
g) if all the element-pairs on the wordline associated with the selected program pattern are determined to be programmed in the reprogram verify:
saving the drain voltage as a learned program drain voltage;
h) if any of the element-pairs associated with the selected program pattern are determined to be unprogrammed in the reprogram verify:
increasing the drain voltage according to a predetermined voltage step increase, and
reapplying a program pulse to the unprogrammed element-pairs on the wordline using the initial gate voltage and the increased drain voltage, and
i) repeating steps f) thru h) until all the element-pairs associated with the selected program pattern are determined to be programmed.

20. The method of claim 19, wherein the predetermined voltage step increase is derived from a look-up table of at least one of a drain voltage value, an incremental drain voltage value, a gate voltage value, and an incremental gate voltage value.

21. The method of claim 19, wherein the selecting a program pattern from the one or more program patterns comprises initially selecting a first program pattern corresponding to a first program level and saving the resulting learned first drain voltage, then repeating the drain voltage learning for each of the other two or more program levels and respective learned program drain voltages.

22. The method of claim 19, wherein the selecting a program pattern from the one or more program patterns comprises initially selecting a first program pattern corresponding to the lowest program levels and saving the resulting learned first drain voltage, then determining each of the other learned program drain voltages based on the learned first drain voltage of the first program level.

23. The method of claim 15, wherein the performing the core programming operation on the core element-pairs of the array using the learned program drain voltage, until a sense current of each element of the core element-pairs generally corresponds to the determined program verify current for the respective program pattern, comprises:

a) selecting a program pattern from the one or more program patterns;
b) program verifying all the element-pairs on the wordline associated with the selected program pattern using the program verify gate voltage and program verify current, to identify unprogrammed element-pairs, and programmed element-pairs;
c) selecting a core gate voltage for programming the core element-pairs according to the program pattern;
d) utilizing the learned program drain voltage for the corresponding program level used in the selected program pattern as an initial value for programming the core element-pairs;
e) applying a program pulse to the unprogrammed element-pairs on the word line using the core gate voltage and the learned program drain voltage;

f) reprogram verifying all the element-pairs associated with the selected program pattern using the program verify gate voltage and program verify current;
g) if all the element-pairs on the wordline associated with the selected program pattern are determined to be programmed in the reprogram verify:
  repeating steps a) thru h) for each of the other two or more program patterns at each of the other two or more program levels and respective learned program drain voltages;
h) if any of the element-pairs associated with the selected program pattern are determined to be unprogrammed in the reprogram verify:
  increasing the program drain voltage incrementally according to a predetermined voltage step increase,
  reapplying a program pulse to the unprogrammed element-pairs on the wordline using the core gate voltage and the increased program drain voltage, and
  repeating steps f) thru h) until all the element-pairs associated with the selected program pattern are determined to be programmed.

24. The method of claim 23, wherein the predetermined voltage step increases are derived from a look-up table of at least one of a drain voltage value, an incremental drain voltage value, a gate voltage value, and an incremental gate voltage value.

25. A method of programming two or more memory cell elements on a wordline of a multi-level flash memory array in a single programming phase, the memory cell elements individually having two or more program levels and a blank level, the levels comprising three or more data levels corresponding to three or more threshold voltages, the method comprising:
  providing one or more unprogrammed memory cell core elements of the two or more memory cell elements on the wordline to be programmed;
  providing one or more memory cell learn elements of the two or more memory cell elements on the wordline for determining a program drain voltage therefrom;
  determining a program verify gate voltage and program verify current for each of the program levels on the wordline of the memory array;
  performing a patterned programming operation on the memory cell learn elements of the wordline of the array using a program word comprising each of the two or more program levels, the determined program verify gate voltage, and the determined program verify current, until each element of the learn elements generally corresponds to the respective program level;
  learning a program drain voltage required to program the wordline to a predetermined one of the three or more data levels; and
  performing a core programming operation on the core elements of the array using the learned program drain voltage and the determined program verify current, until each element of the core elements generally corresponds to the respective program level.

* * * * *